United States Patent [19]

Conzelmann et al.

[11] Patent Number: 4,742,425
[45] Date of Patent: May 3, 1988

[54] MULTIPLE-CELL TRANSISTOR WITH BASE AND EMITTER FUSE LINKS

[75] Inventors: Gerhard Conzelmann, Leinfelden-Echterdingen; Karl Nagel, Gomaringen, both of Fed. Rep. of Germany

[73] Assignee: Robert Bosch GmbH, Stuttgart, Fed. Rep. of Germany

[21] Appl. No.: 50,294

[22] PCT Filed: Aug. 25, 1986

[86] PCT No.: PCT/DE86/00327
§ 371 Date: May 5, 1987
§ 102(e) Date: May 5, 1987

[87] PCT Pub. No.: WO87/01867
PCT Pub. Date: Mar. 26, 1987

[30] Foreign Application Priority Data

Sep. 11, 1985 [DE] Fed. Rep. of Germany ....... 3532383

[51] Int. Cl.$^4$ .............................................. H02H 5/04
[52] U.S. Cl. ...................................... 361/104; 361/103
[58] Field of Search ................... 361/93, 86, 103, 104, 361/54–57; 307/200 A, 253, 264

[56] References Cited

U.S. PATENT DOCUMENTS

| 2,925,548 | 2/1960 | Scherer | 361/56 X |
| 3,258,704 | 6/1966 | Wittman | 307/264 X |
| 3,509,423 | 4/1970 | Czerny | 361/56 |
| 3,819,986 | 6/1974 | Fukuoka | 361/56 X |
| 4,325,222 | 4/1982 | Nakamura et al. | 361/104 X |
| 4,412,265 | 10/1983 | Buuck | 361/56 X |
| 4,562,509 | 12/1985 | Lindgren | 361/104 |
| 4,686,602 | 8/1987 | Bucksch | 361/56 X |

FOREIGN PATENT DOCUMENTS

| 165971 | 9/1984 | Japan | 361/104 |
| 907672 | 2/1982 | U.S.S.R. | 361/104 |

Primary Examiner—J. R. Scott
Assistant Examiner—A. Jonathan Wysocki
Attorney, Agent, or Firm—Michael J. Striker

[57] ABSTRACT

A multiple-cell transistor consists of a parallel connection of individual transistor cells (41, 42) for power distribution. Fuse links (6, 7), which separate the defective transistor cells from the compound in the event of a short circuit, are provided for the purpose of automatically separating defective transistor cells. A voltage-controlled switch (9) is provided for improved separation of the base fuse link (7).

8 Claims, 4 Drawing Sheets

MULTIPLE-CELL TRANSISTOR WITH BASE AND EMITTER FUSE LINKS

PRIOR ART

The invention is based on a multiple-cell transistor consisting of parallel connections of individual transistor cells provided between respective base, emitter and collector bus bars and wherein a fuse path or link is connected in the collector-emitter paths and in the base connection of each transistor cell.

Such a multiple-cell transistor is already known from DE-PS No. 24 08 540. The multiple-cell transistor consists of a parallel connection of individual transistor cells between a common base, emitter and collector connection bar, by each instance, and is preferably constructed by integrated technology. The particular disadvantage of such a multiple-cell transistor consists in that the entire multiple-cell transistor is made inoperative when there is a short-circuit defect in a single transistor cell. Such defects can occur during production because of fabrication dispersion or due to impurities during manufacturing, but they can also be caused during operation by means of local thermal overloading or sudden over-voltage. The transistor cells which are defective because of production can be localized by means of subsequent individual measurement and can be separated from the composite structure by means of burning out the fuse segments of a connection. The transistor cells which become defective during the operation of the multiple-cell transistor, on the other hand, must be able to separate themselves so that a so-called self-healing effect is achieved.

ADVANTAGES OF THE INVENTION

The multiple-cell transistor, according to the invention, comprising voltage controlled switches connected between a connection bar and the connection point of a fuse link with the base connection, which is remote from the base, has the advantage that a particularly secure automatic separation of a defective transistor cell is achieved. Accordingly, it is possible to use broader structures for the base fuse link in integrated technology and to lower the requirements for finishing accuracy.

It is particularly simple to construct the voltage-disturbed switch by means of a single Zener diode which can be made in a particularly simple manner in integrated engineering by means of a transistor which is operated in the blocking direction and whose base and collector are connected to one another. A particularly advantageous switching characteristic of the voltage-controlled switch is achieved by means of using a thyristor. The latter can be activated by means of a Zener diode or by means of a voltage divider. In monolithic integrated engineering this thyristor can be produced in a particularly simple manner by means of connecting a p-n-p transistor with a n-p-n transistor.

DRAWING

Three embodiment examples of the invention are shown in the drawing and explained in more detail in the following description.

DESCRIPTION OF THE EMBODIMENT EXAMPLES

Figure 1:
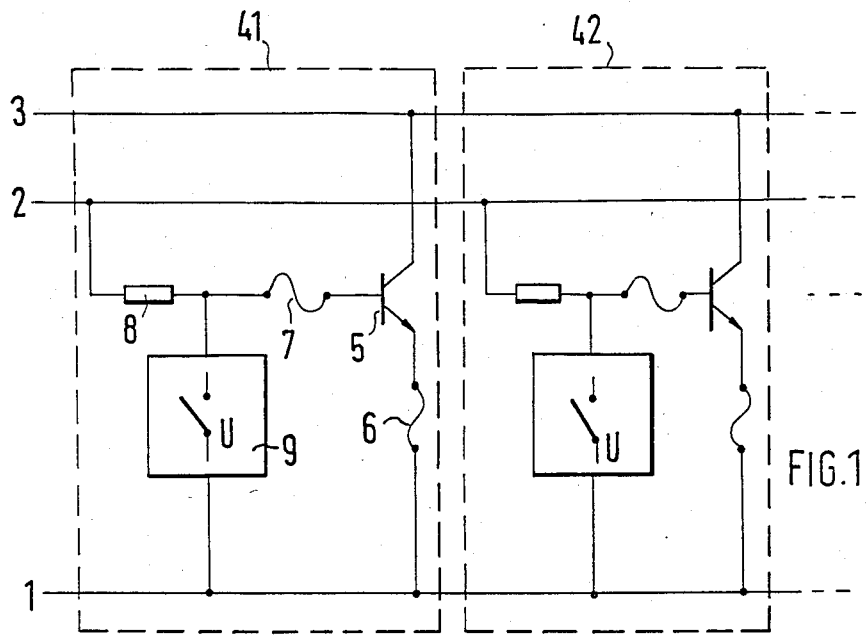
FIG. 1 shows the basic wiring of a multiple-cell transistor according to the invention.

FIG. 1 shows an emitter bus bar 1, base bus bar 2 and collector bus bar 3 of a multiple-cell transistor, according to the invention, of which only a first transistor cell 41 and a second transistor cell 42 are shown in FIG. 1 for the sake of simplicity. Other transistor cells, which are not shown, are connected in parallel so that there is a lower power distribution to each individual transistor cell of the whole multiple-cell transistor.

The transistor cell 41 contains an output transistor 5 whose collector is connected to the collector bus bar 3 and whole emitter is connected to the emitter bus bar 1, via an emitter fuse link or segment 6. Another fuse link 7 is connected to the base of the output transistor 5 and is connected to the base bus bar 2 via a base resistor 8. In addition, a voltage-controlled switch 9 is connected between the connection point of the base fuse link 7 and the base resistor 8, and the emitter bus bar 1.

The circuit shown in basic form in FIG. 1 operates in the following manner. If a defect occurs in a transistor cell during the operation of the multiple-cell transistor, which defect signifies a short-circuit in the output transistor 5, a higher short-circuit current occurs between the collector bus bar 3 and the emitter bus bar 1 via the defective output transistor 5, which causes the emitter fuse link 6 to be severed. Subsequently, the base of the defective output transistor 5 is brought via the collector practically to the potential of the collector bus bar 3. The voltage-controlled switch 9 turns on automatically so that a higher current flows through the base fuse link 7, and finally also severs the base fuse link 7. Accordingly, the defective transistor cell is completely separated from the multiple-cell transistor structure.

Figure 2:
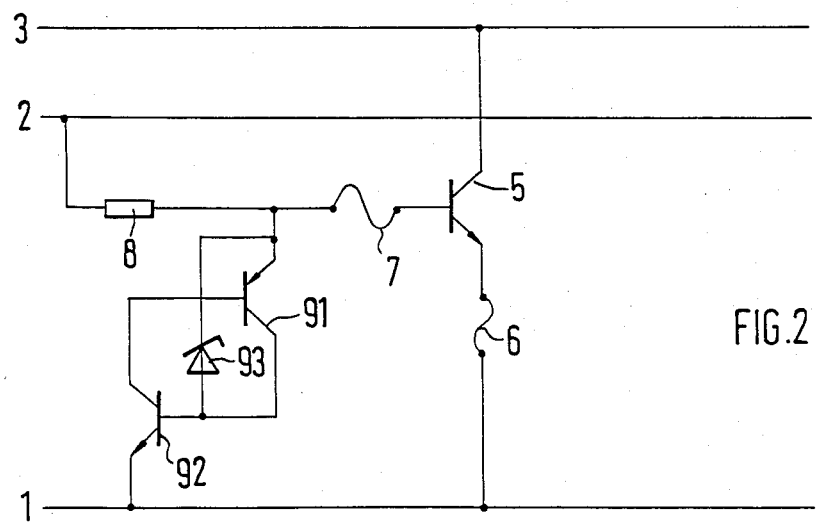
FIG. 2 shows a circuit diagram of a transistor cell according to the first embodiment example.

FIG. 2 shows a first embodiment example of the invention, wherein, as in FIG. 1, the output transistor is designated by 5, the emitter fuse link by 6, the base fuse link by 7, and the base resistor by 8. The voltage-controlled switch 9 is realized by means of a thyristor which is constructed in a known manner by means of a p-n-p transistor 91 in connection with a n-p-n transistor 92. For this purpose, the base of the p-n-p transistor 91 is connected with the collector of the n-p-n transistor 92, and the collector of the p-n-p transistor 91 is connected with the base of the n-p-n transistor 92. The emitter of the p-n-p transistor 91 is connected to the base fuse link 7, and the emitter of the n-p-n transistor 92 is connected to the emitter bus bar 1. A Zener diode 93 is connected to the emitter of the p-n-p transistor 91 by its cathode, its anode is connected to the base of the n-p-n transistor 92. It serves to activate the thyristor.

If a short-circuit occurs in the output transistor 5, which first severs the emitter fuse link 6, the Zener diode 93 is brought to the electrically conductive state by means of the increasing potential of the base of the defective output transistor 5, and the thyristor, which is formed by means of the transistors 91, 92, is activated and the base fuse link 7 is severed.

Figure 3:
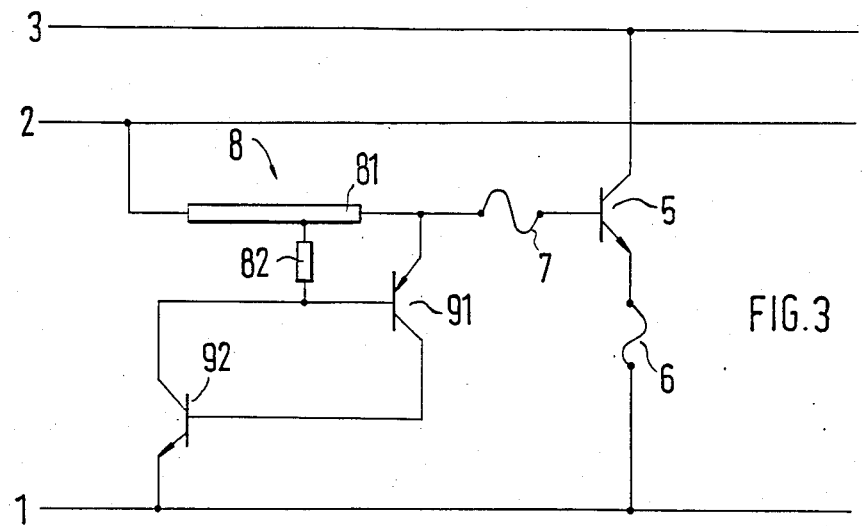
FIG. 3 shows a transistor cell according to the second embodiment example.

FIG. 3 shows a second embodiment example of the invention with the aid of a single transistor cell. As in FIG. 2, the output transistor is designated by 5, the emitter fuse link by 6, the base fuse link by 7, and the p-n-p transistor and n-p-n transistor, which form the thyristor, by 91 and 92, respectively. However, the thyristor is not activated by means of a Zener diode, but by means of a special construction of the base resistor 8, which is formed in FIG. 3 by means of a base resistor 81 and a divider resistor 82. For this purpose, the divider resistor 82 is connected between the base of the p-n-p transistor 91 and a divider point of the base resistor 81. Otherwise, the operation of the circuit according to FIG. 3 is equivalent to that according to FIG. 2.

Figure 4:
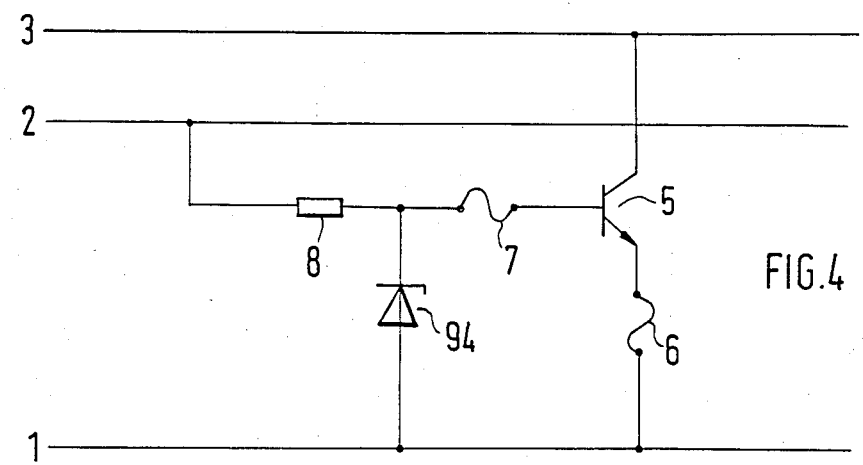
FIG. 4 shows a circuit diagram of a transistor cell according to the third embodiment example.

FIG. 4 shows a third embodiment example of the invention by means of an individual transistor cell. As in the previous examples, the output transistor is again designated by 5, the emitter fuse link by 6, the base fuse link by 7, and the base resistor by 8. However, a single Zener diode 94, which is connected between the base fuse link 7 and the emitter bus bar 1 for this reason, now serves as the switch. In this case, as well, the operation of the circuit according to FIG. 4 is equivalent to that according to the two preceding embodiment examples.

Figure 5:
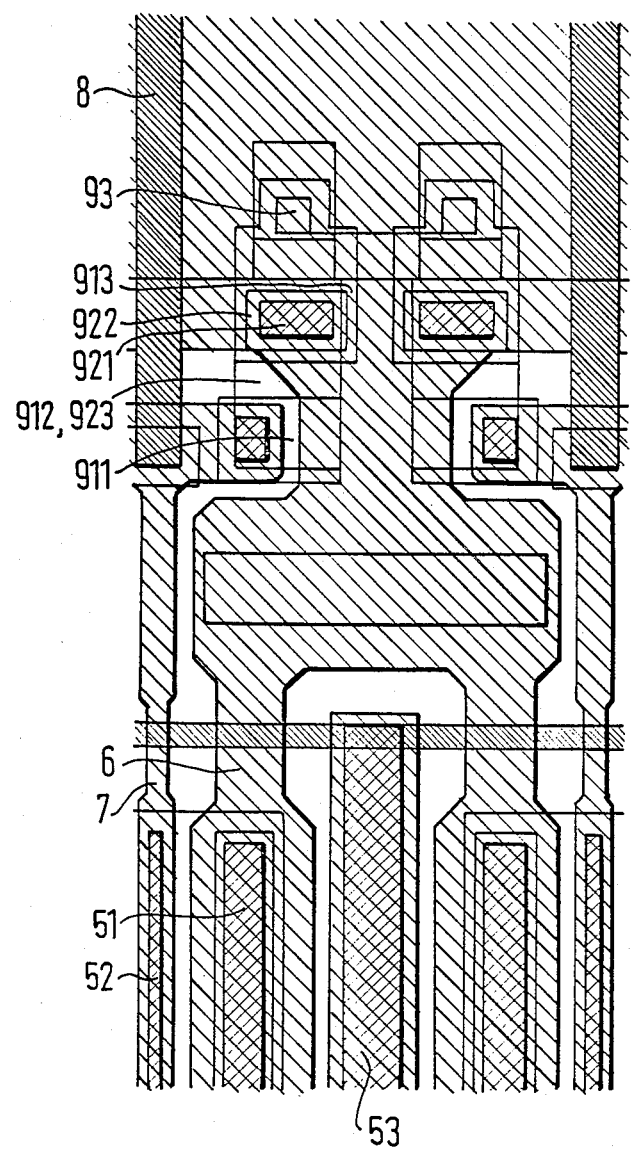
FIG. 5 shows a top view of a transistor cell according to the first embodiment example.

FIG. 5 shows a top view of an integrated transistor cell according to the first embodiment example according to FIG. 2. The broad emitter fuse link 6, which can pass a high current, and the base fuse link 7, which is relatively narrow in comparison to the fuse link 6, are apparent. The emitter of the output transistor 5 is designated by 51 and its base and collector are correspondingly designated by 52 and 53, respectively. The base fuse link 7 leads to the base resistor 8, wherein the emitter 911 of the p-n-p transistor 91 of the thyristor is connected to its connection contact. The base of the p-n-p transistor 91 and the collector of the n-p-n transistor 92, which collector is formed simultaneously, are designated by 912 and 923, respectively. The diffusion zone, designated by 913, represents the collector of the p-n-p transistor 91. The emitter is designated by 921, and the base of the n-p-n transistor 92 is designated by 922. Above the thyristor, which is formed by means of the latter, the drawing shows the diffusion zone 93, which represents the Zener diode, according to FIG. 2, which has the same designation.

This preferred integration of the circuit, according to the invention, according to the first embodiment example, is only one of many possibilities of integration available to one skilled in the art. The invention is accordingly not limited to the embodiment example selected here.

Figure 6:
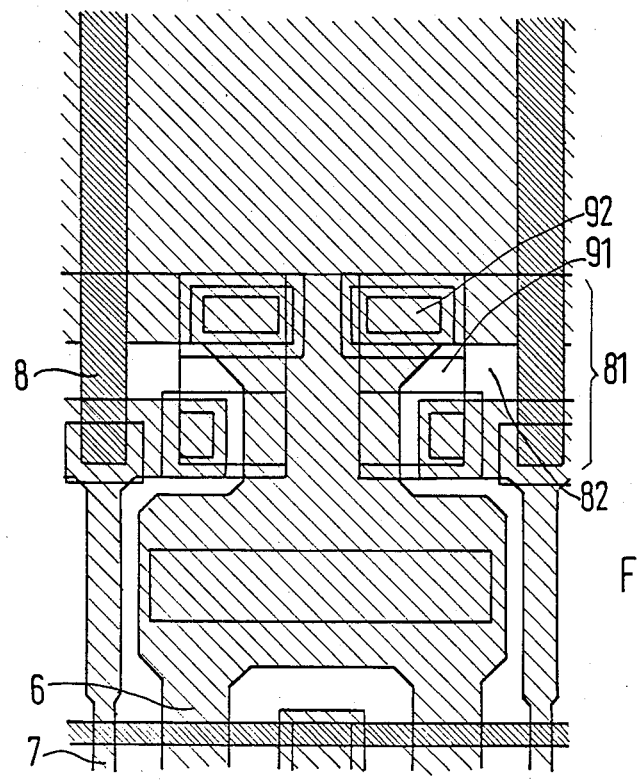
FIG. 6 shows a view of a circuit diagram of a transistor cell according to the second embodiment example.

FIG. 6 shows the top view of an integrated circuit according to the second embodiment example, according to FIG. 3. As in FIG. 5, the emitter fuse link is designated by 6, and the base fuse link, which leads to the base resistor 8, is designated by 7. On the right-hand side of FIG. 6, 81 more closely designates the area of the the base resistor 8 as it corresponds to the divider resistor of the base resistor 8 in FIG. 3, which the divider resistor is designated in the same way. The divider resistor 82 is shown by means of the epitaxial zone, which is designated in the same way in FIG. 6. The p-n-p transistor 91 and the n-p-n transistor 92 of the thyristor are shown in addition.

What is claimed is:

1. Multiple-cell transistor consisting of parallel connections of individual transistor cells provided between respective base, emitter and collector bus bars, wherein a fuse link (6, 7) is connected in the collector-emitter path and in the base connection of each transistor cell, comprising voltage-controlled switches for severing said fuse links in the case of defects, each of said switches being connected between a connection bar (1) and the connection point of a fuse link with said base connection, which is remote of the base.

2. Multiple-cell transistor according to claim 1, wherein a resistor (8) is connected between said connection point and said bas bus bar (2).

3. Multiple-cell transistor according to claim 2, wherein said resistor (8) is formed by means of at least one semiconductor segment, preferably a diode.

4. Multiple-cell transistor according to claim 1, wherein each of said voltage-controlled switches is formed by a Zener diode.

5. Multiple-cell transistor according to claim 1, wherein each of said voltage-controlled switches is formed by a thyristor.

6. Multiple-cell transistor according to claim 5, wherein said thyristor is activated by means of a Zener diode which is connected to said fuse link at said connection point.

7. Multiple-cell transistor according to claim 5, wherein said thyristor is activated by means of a resistor which is connected to a component part which is dependent on the base potential of an output transistor cell.

8. Multiple-cell transistor according to claim 5, wherein said thyristor is formed by a combination of a p-n-p transistor and a n-p-n transistor.

* * * * *